(12) United States Patent
Lee et al.

(10) Patent No.: US 8,921,129 B2
(45) Date of Patent: Dec. 30, 2014

(54) DONOR SUBSTRATE AND METHOD OF FORMING TRANSFER PATTERN USING THE SAME

(71) Applicant: Samsung Display Co., Ltd., Yongin, Gyeonggi-Do (KR)

(72) Inventors: Joon Gu Lee, Yongin-si (KR); Won Jong Kim, Yongin-si (KR); Ji Young Choung, Yongin-si (KR); Jin Baek Choi, Yongin-si (KR); Yeon Hwa Lee, Yongin-si (KR); Hyunsung Bang, Yongin-si (KR); Young-Woo Song, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/061,961

(22) Filed: Oct. 24, 2013

(65) Prior Publication Data

US 2014/0357000 A1    Dec. 4, 2014

(30) Foreign Application Priority Data

May 28, 2013    (KR) ........................ 10-2013-0060487

(51) Int. Cl.
*H01L 21/00*    (2006.01)
*H01L 51/00*    (2006.01)
*H01L 51/56*    (2006.01)

(52) U.S. Cl.
CPC ............ *H01L 51/0013* (2013.01); *H01L 51/56* (2013.01)

USPC ................ 438/24; 349/21; 349/22; 430/300; 430/275.1

(58) Field of Classification Search
CPC .................................................... H01L 51/0013
USPC .............. 438/24; 349/22, 21; 430/275.1, 300, 430/307

See application file for complete search history.

(56) References Cited

U.S. PATENT DOCUMENTS

| | | | |
|---|---|---|---|
| 6,284,425 B1 * | 9/2001 | Staral et al. ................... | 430/201 |
| 2002/0124755 A1 * | 9/2002 | Lewis ............................ | 101/457 |
| 2006/0084006 A1 | 4/2006 | Kang et al. | |

FOREIGN PATENT DOCUMENTS

| KR | 1020060034575 A | 4/2006 |
|---|---|---|
| KR | 1020110132021 A | 12/2011 |

* cited by examiner

*Primary Examiner* — Caridad Everhart
(74) *Attorney, Agent, or Firm* — Cantor Colburn LLP

(57) ABSTRACT

A donor substrate includes a base substrate; a light reflection layer on the base substrate and partially overlapping the base substrate; a light-to-heat conversion layer on the base substrate, and including a combination layer including an insulating material and a first metal material; and a transfer layer on the light-to-heat conversion layer. A ratio of the first metal material in the combination layer to the insulating material in the combination layer increases as a distance from the base substrate increases along a thickness direction of the light-to-heat conversion layer.

27 Claims, 11 Drawing Sheets

DONOR SUBSTRATE AND METHOD OF FORMING TRANSFER PATTERN USING THE SAME

This application claims priority to Korean Patent Application No. 10-2013-0060487, filed on May 28, 2013, and all the benefits accruing therefrom under 35 U.S.C. §119, the contents of which are hereby incorporated by reference.

BACKGROUND

1. Field

The invention relates to a donor substrate and a method of forming a transfer pattern using the donor substrate. More particularly, the invention relates to a donor substrate having a light-to-heat conversion layer which includes a combination layer, and a method of forming a transfer pattern using the donor substrate.

2. Description of the Related Art

As a method of forming an organic/inorganic pattern (hereinafter, referred to as a transfer pattern) on a transfer-target substrate, a laser thermal transfer imaging method has been used. For instance, the laser thermal transfer imaging method is used to form a pattern of an organic light emitting device.

The laser thermal transfer imaging method is performed using a donor substrate. The donor substrate includes a light-to-heat conversion layer to convert light emitted from a light source to heat. As a light absorption rate of the light-to-heat conversion layer increases, i.e., as a light reflectivity decreases, the transfer pattern is easily transferred.

SUMMARY

One or more exemplary embodiment of the invention provides a donor substrate having an improved light absorption rate.

One or more exemplary embodiment of the invention provides a method of forming a transfer pattern using the donor substrate.

An exemplary embodiment of the invention provides a donor substrate including a base substrate, a light reflection layer on the base substrate and partially overlapping the base substrate; a light-to-heat conversion layer on the base substrate, and including a combination layer including an insulating material and a first metal material; and a transfer layer on the light-to-heat conversion layer. A ratio of the first metal material in the combination layer to the insulating material in the combination layer increases as a distance from the base substrate increases along a thickness direction of the light-to-heat conversion layer.

The light-to-heat conversion layer may further include a metal layer on the combination layer and including the first metal material in the combination layer. The light-to-heat conversion layer may further include an insulating layer between the base substrate and the combination layer, and including the insulating material in the combination layer. The ratio of the first metal material in the combination layer to the insulating material increases linearly as the distance from the base substrate increases along the thickness direction of the light-to-heat conversion layer.

The insulating material may include silicon oxide, silicon nitride, or organic polymer.

The metal material of the combination layer may include chromium, titanium, aluminum, molybdenum, tantalum, tungsten, or an alloy thereof.

A plurality of openings may be defined in the light reflection layer, and the light reflection layer may include a second metal material.

Another exemplary embodiment of the invention provides a method of providing a transfer pattern, the method including disposing a donor substrate on a transfer-target substrate to contact a transfer layer of the donor substrate with the transfer-target substrate, the donor substrate including: a base substrate, a light reflection layer on the base substrate and partially overlapping the base substrate, a light-to-heat conversion layer on the base substrate and including a combination layer including an insulating material and a metal material, and the transfer layer on the light-to-heat conversion layer, irradiating a light onto the donor substrate to provide the transfer pattern on the transfer-target substrate; and separating the donor substrate from the transfer-target substrate. A ratio of the metal material in the combination layer to the insulating material in the combination layer increases as a distance from the base substrate increases along a thickness direction of the light-to-heat conversion layer.

The providing the transfer pattern may provide a pattern of an organic light emitting device, and the providing the pattern of the organic light emitting device may provide a hole transport layer or an organic light emitting layer of the organic light emitting device.

According to one or more exemplary embodiment of the invention, the donor substrate includes the light-to-heat conversion layer with a substantially uniform thickness, and including both an insulating and a metal material. Thus, the light-to-heat conversion layer has a light absorption rate higher than that of the light-to-heat conversion layer including only metal. In addition, in an exemplary embodiment of forming the donor substrate, contamination of a deposition chamber while the light-to-heat conversion layer is formed may be reduced or effectively prevented.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
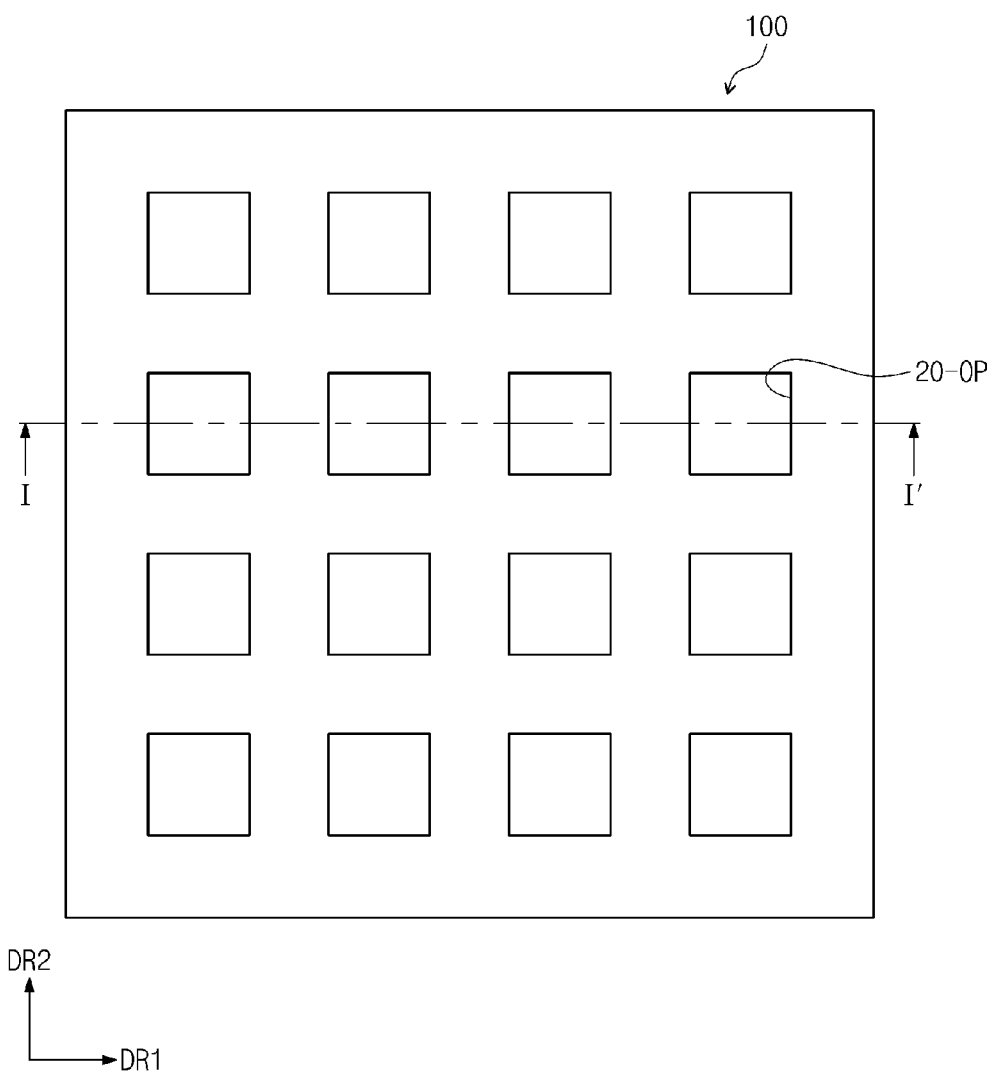
FIG. 1 is a plan view showing an exemplary embodiment of a donor substrate according to the invention.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A laser thermal transfer imaging method provides an organic/inorganic pattern (hereinafter, referred to as a transfer pattern) on a transfer-target substrate, by using a donor substrate. The donor substrate may include a light-to-heat conversion layer to convert light emitted from a light source to heat.

The light-to-heat conversion layer includes carbon or metal. However, when the light-to-heat conversion layer includes carbon, a thickness uniformity of the light-to-heat conversion layer is difficult to achieve. In addition, when the light-to-heat conversion layer includes carbon, a deposition chamber is contaminated while carbon is deposited onto the donor substrate. The light-to-heat conversion layer including metal has a relatively low light absorption rate. Therefore, there remains a need for an improved light-to-heat conversion layer having a uniform thickness and a relatively high absorption rate, while reducing or preventing contamination of a donor substrate.

Hereinafter, the invention will be explained in detail with reference to the accompanying drawings.

Figure 2:
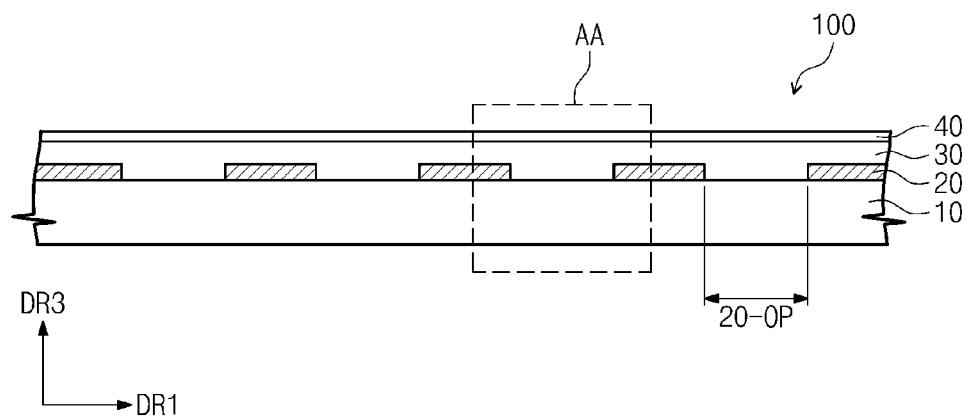
FIG. 2 is a cross-sectional view taken along line I-I' of FIG. 1.
Figure 3:
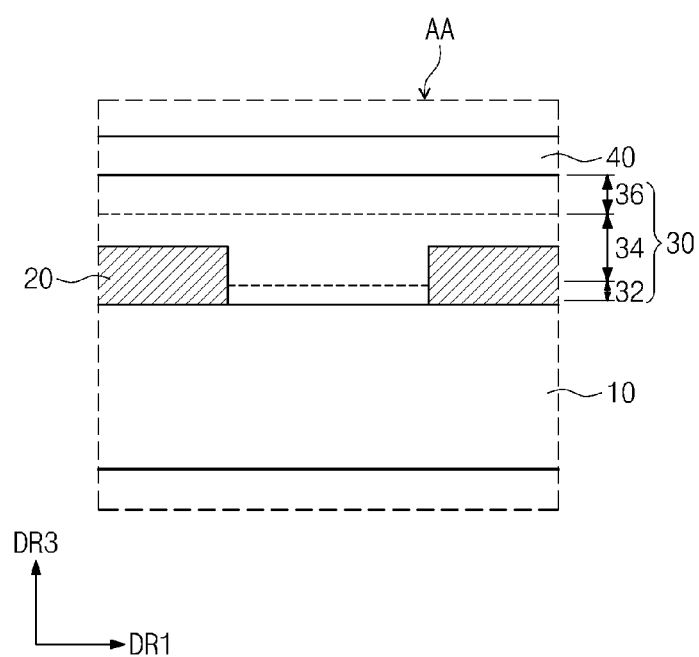
FIG. 3 is an enlarged view showing portion AA of FIG. 2.

FIG. 1 is a plan view showing an exemplary embodiment of a donor substrate according to the invention, FIG. 2 is a cross-sectional view taken along line I-I' of FIG. 1, and FIG. 3 is an enlarged view showing portion AA of FIG. 2. Hereinafter, an exemplary embodiment of a donor substrate according to the invention will be described in detail with reference to FIGS. 1 to 3.

Referring to FIGS. 1 and 2, a donor substrate 100 includes a base substrate 10, a light reflection layer 20, a light-to-heat conversion layer 30 and a transfer layer 40. The light reflection layer 20, the light-to-heat conversion layer 30 and the transfer layer 40 are disposed on one (e.g., a same) surface of the base substrate 10.

The base substrate 10 is transparent to transmit a light incident to the surface of the base substrate 10, which faces the one surface, to the light-to-heat conversion layer 30. The base substrate 10 may include at least one polymer material selected from polyester, polyacryl, poly-epoxy, polyethylene, polystyrene and polyethylene terephthalate, and a combination thereof. In addition, the base substrate 10 may include glass or quartz.

The light reflection layer 20 is disposed on the one surface of the base substrate 10. The light reflection layer 20 overlaps a portion of the base substrate 10. The light reflection layer 20 partially blocks the light incident thereto through the other surface of the base substrate 10.

The light reflection layer 20 has a specific shape in a plan view to effectively divide the transfer layer 40 into a transmission area and a non-transmission area. In one exemplary embodiment, for example, a plurality of openings 20-OP is defined in the light reflection layer 20. In an exemplary embodiment of manufacturing a donor substrate, a transfer pattern TP (shown in FIG. 8C) has a shape determined depending on a final shape of the openings 20-OP and the light reflection layer 20. The light reflection layer 20 may be omitted in order to transfer an entirety of the transfer layer 40.

The light reflection layer 20 includes a metal that reflects the incident light. The light reflection layer 20 may include at least one of aluminum, aluminum alloy, silver and silver alloy, and a combination thereof.

The light-to-heat conversion layer 30 absorbs the light incident thereto to convert the absorbed light energy to heat energy. The light-to-heat conversion layer 30 may absorb a specific wavelength of the incident light, e.g., an infrared ray wavelength range and/or a visible ray wavelength range.

The light-to-heat conversion layer 30 is disposed to overlap the openings 20-OP defined in the light reflection layer 20. The light-to-heat conversion layer 30 is disposed on an entire surface of the base substrate 10 to cover the light reflection layer 20. The light-to-heat conversion layer 30 may have a substantially planar shape, such as include an upper flat surface. The light reflection layer 20 is between the base substrate 10 and the light-to-heat conversion layer 30, in the plan view.

Hereinafter, the light-to-heat conversion layer 30 will be described in detail with reference to FIG. 3. The light-to-heat conversion layer 30 may be divided into a plurality of areas, each of which has a different ratio of the metal along a thickness direction DR3 (hereinafter, referred to as a third direction) of the light-to-heat conversion layer 30. As shown in FIG. 1, the third direction DR3 is substantially perpendicular to first and second directions DR1 and DR2 which define a transfer surface.

The light-to-heat conversion layer 30 includes an insulating layer 32, a combination layer 34 and a metal layer 36. The combination layer 34 includes a combination of insulating material and metal. The ratio or concentration of the metal in the combination layer 34 increases as a distance from the base substrate 10 increases in the third direction DR3. The insulating layer 32 includes only the insulating material, and the metal layer 36 includes only the metal. The combination layer 34 is disposed on the insulating layer 32, and the metal layer 36 is disposed on the combination layer 34.

Consequently, the ratio of the metal in the light-to-heat conversion layer 30 increases as the distance from the base substrate 10 in the third direction DR3 increases. In an alternative exemplary embodiment, one of the insulating layer 32 or the metal layer 36 may be omitted.

Since the ratio of the metal in the light-to-heat conversion layer 30 changes along the third direction DR3, a refractive index of the light-to-heat conversion layer 30 becomes different along the third direction DR3. In one exemplary embodiment, for instance, the refractive index of the light-to-heat conversion layer 30 is changed linearly along the third direction DR3. The combination layer 34 is effectively changed from the insulating material to the metal along the third direction DR3 without an interface between the insulating and metal materials. The insulating material and the metal material may be present at each thickness level in the combination layer 34, but in varying amounts. Therefore, a light absorption rate of the light-to-heat conversion layer 30 increases, especially in the combination layer 34.

The insulating material may include an organic material or an inorganic material. The insulating material may include silicon oxide or silicon nitride. In addition, the insulating material may include an organic polymer. The metal includes at least one of chromium, titanium, aluminum, molybdenum, tantalum, tungsten and an alloy thereof, and a combination thereof.

Referring again to FIGS. 1 and 2, the transfer layer 40 is disposed on the light-to-heat conversion layer 30. The transfer layer 40 overlaps the openings 20-OP of the light reflection layer 20.

The transfer layer 40 includes an organic material that is transferred upon receiving the heat energy. In one exemplary embodiment, for instance, the transfer layer 40 may include an organic material for a color filter or a functional material for an organic light emitting device, as the organic material evaporated by the heat energy, however, not being limited thereto or thereby.

Figure 4:
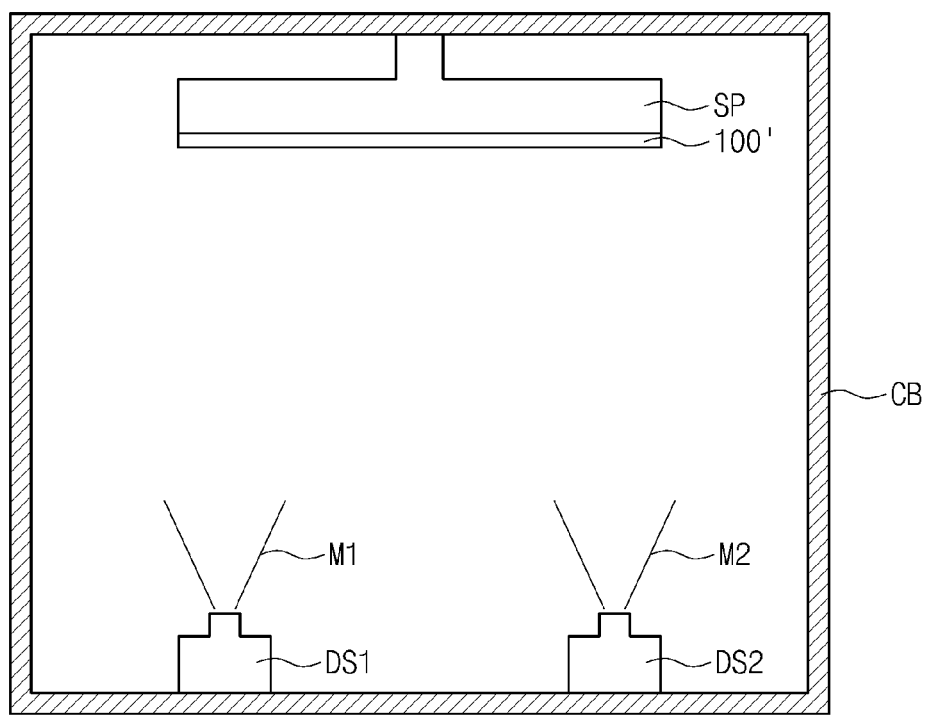
FIG. 4 is a side cross-sectional view showing an exemplary embodiment of a deposition chamber in which a light-to-heat conversion layer is formed.
Figure 5:
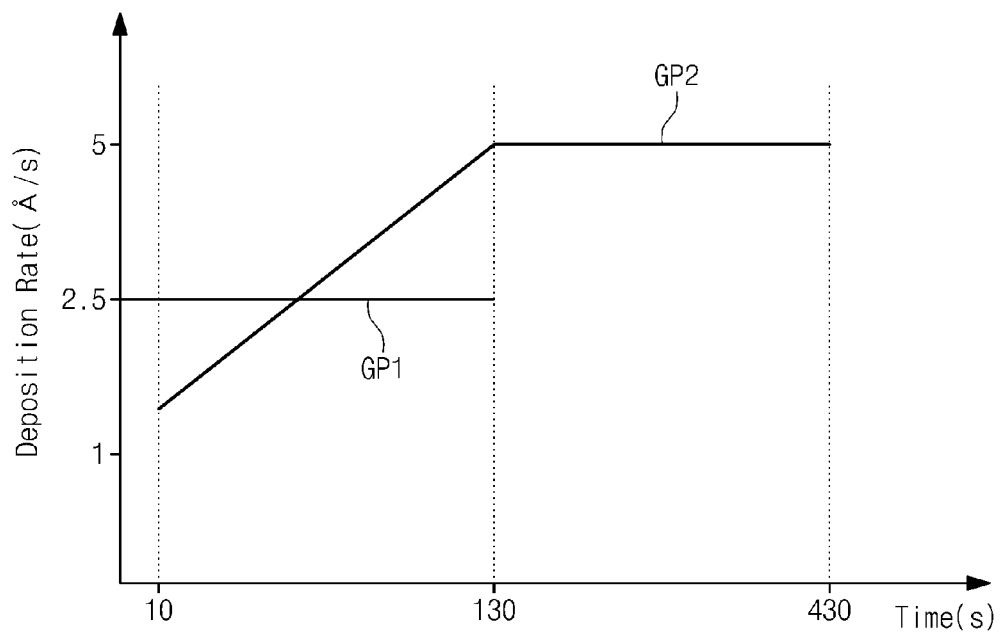
FIG. 5 is a graph showing an exemplary embodiment of an amount of deposition material provided from deposition sources shown in FIG. 4, as a function of a deposition rate in angstroms per second (Å/s) over time in seconds (s)

FIG. 4 is a side cross-sectional view showing a deposition chamber in which the light-to-heat conversion layer is formed (e.g., provided), and FIG. 5 is a graph showing an exemplary embodiment of an amount of deposition material provided from deposition sources shown in FIG. 4, as a function of a deposition rate in angstroms per second (Å/s) over time in seconds (s).

In FIG. 5, a first graph GP1 represents a deposition amount of the insulating material deposited and a second graph GP2 represents an amount of the metal deposited. Hereinafter, an exemplary embodiment of a method of forming the donor substrate according to the invention will be described with reference to FIGS. 4 and 5.

Referring to FIG. 4, a deposition apparatus includes a deposition chamber CB, a first deposition source DS1, a second deposition source DS2 and a holder SP. A base substrate 100' having the light reflection layer 20 (refer to FIG. 3) thereon is fixed to the holder SP. The light reflection layer 20 may be formed (e.g., provided) through a photolithography process.

The deposition chamber CB accommodates the first deposition source DS1, the second deposition source DS2 and the holder SP therein. During a deposition process, an inside of the deposition chamber CB is maintained in a vacuum state. A vacuum pump (not shown), which forms the vacuum state, may be connected to the deposition chamber CB, such as to an inner area or space defined in the deposition chamber CB.

The first deposition source DS1 and the second deposition source DS2 are disposed on a bottom surface of the deposition chamber CB. The first deposition source DS1 provides the insulating material M1, and the second deposition source DS2 provides the metal M2.

The first deposition source DS1 evaporates the insulating material M1, and the second deposition source DS2 evaporates the metal M2. The first deposition source DS1 includes a container (not shown) containing the insulating material M1 and a heat source (not shown) evaporating the insulating material M1, and the second deposition source DS2 includes a container (not shown) containing the metal M2 and a heat source (not shown) evaporating the metal M2, to provide the insulating material M1 and the metal M2, respectively.

In FIG. 5, the first graph GP1 represents the deposition amount of silicon oxide, and the second graph GP2 represents the deposition amount of aluminum. For the first 10 seconds, only silicon oxide is deposited on the base substrate 100'. The deposited silicon oxide serves as the insulating layer 32 (refer to FIG. 3).

Then, during about 120 seconds, the silicon oxide and the aluminum are substantially and simultaneously deposited on the base substrate 100'. A combination of the deposited silicon oxide and the deposited aluminum serves as the combination layer 34 (refer to FIG. 3). The deposition speed of the silicon oxide during the 120 seconds is equal to that of silicon oxide during the first 10 seconds. The deposition speed of the aluminum increases linearly in the 120 seconds. Thus, as the combination layer 34 is formed and increase in thickness, a ratio of the aluminum to the silicon oxide in the combination layer 34 becomes greater.

After the 120 seconds, during about 300 seconds, the aluminum is deposited on the base substrate 100' as a same deposition speed as the maximum deposition speed reached at the end of the 120 seconds. The deposition of the silicon oxide is stopped at the start of the 300 seconds. The deposited aluminum serves as the metal layer 36 (refer to FIG. 3). The transfer layer 40 is layered on the metal layer 36 through a deposition method or a coating method.

Figure 6:
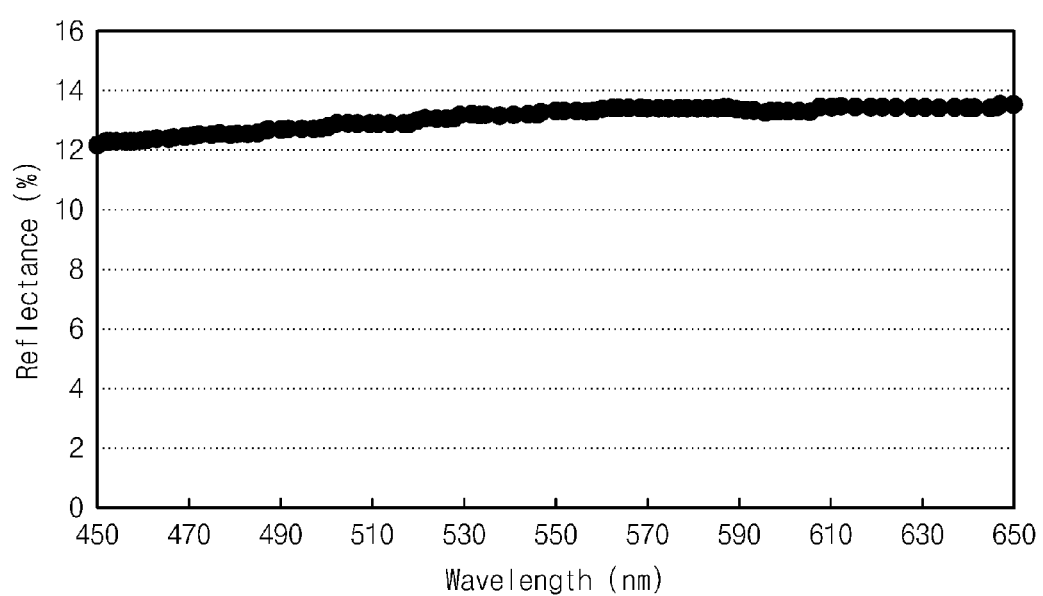
FIG. 6 is a graph showing a reflectance in percent (%) of light wavelength in nanometers (nm) of an exemplary embodiment of a donor substrate according to the invention.
Figure 7:
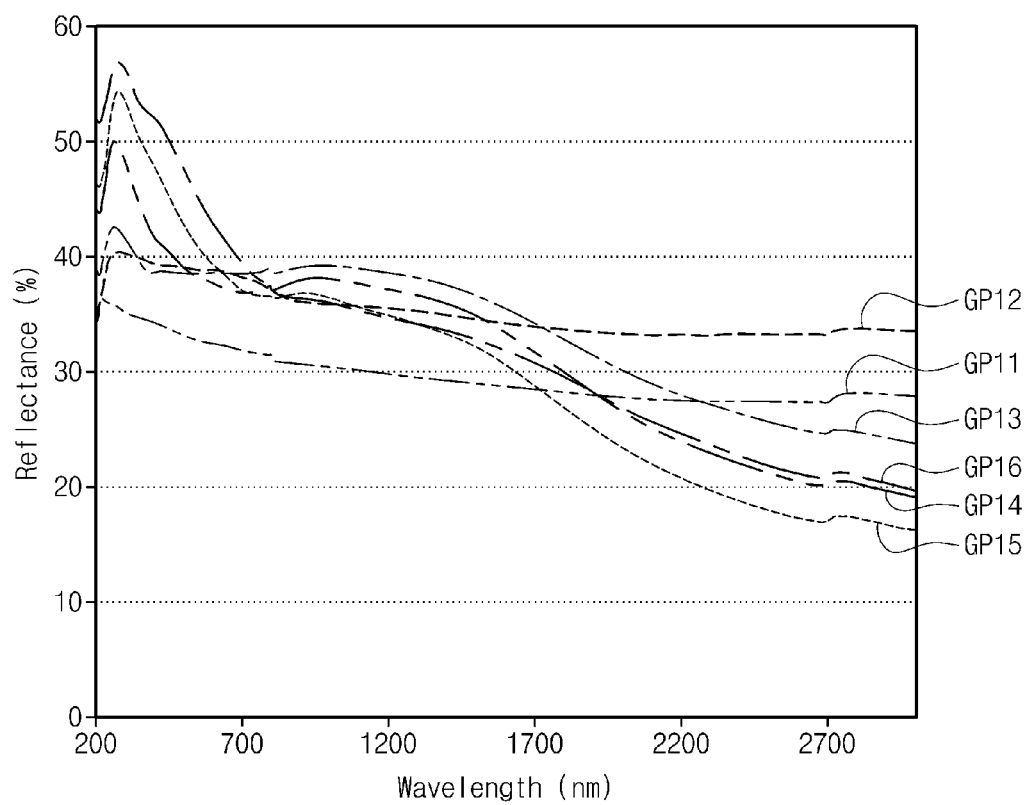
FIG. 7 is a graph showing a reflectance (%) of light wavelength (nm) of a donor substrate including a light-to-heat conversion layer including only metal.

FIG. 6 is a graph showing a reflectance in percent (%) of light wavelength of nanometers (nm) of an exemplary embodiment of a donor substrate according to the invention, and FIG. 7 is a graph showing a reflectance (%) of light wavelengths (nm) of a donor substrate including a light-to-heat conversion layer including only metal (e.g., excluding an insulating layer).

FIG. 6 is showing a reflectance of light by the donor substrate having the light-to-heat conversion layer 30 manufactured according to the exemplary embodiment of the method described with reference to FIG. 5. As shown in FIG. 6, the light reflectance of the donor substrate is from about 12% to about 14% in a visible light ray wavelength range.

In FIG. 7, a first graph GP11 represents a light reflectance of a donor substrate including a light-to-heat conversion layer which includes tungsten and has a thickness of about 50 angstroms, a second graph GP12 represents a light reflectance of a donor substrate including a light-to-heat conversion layer which includes tungsten and has a thickness of about 100 angstroms, and a third graph GP13 represents a light reflectance of a donor substrate including a light-to-heat conversion layer which includes tungsten and has a thickness of about 200 angstroms. A fourth graph GP14 represents a light reflectance of a donor substrate including a light-to-heat conversion layer which includes tungsten and has a thickness of about 300 angstroms, a fifth graph GP15 represents a light reflectance of a donor substrate including a light-to-heat conversion layer which includes tungsten and has a thickness of about 400 angstroms, and a sixth graph GP16 represents a light reflectance of a donor substrate including a light-to-heat conversion layer which includes tungsten and has a thickness of about 500 angstroms.

As represented by the first to sixth graphs GP11 to GP16, the light reflectance of the donor substrate including the light-to-heat conversion layer which is formed of tungsten, is from about 30% to about 55% in the visible light ray wavelength range. As represented by the graphs shown in FIGS. 6 and 7, one or more exemplary embodiment of the donor substrate according to the invention has the light reflectance less than half of the light reflectance of the donor substrate including the light-to-heat conversion layer formed of tungsten.

Figure 8A:
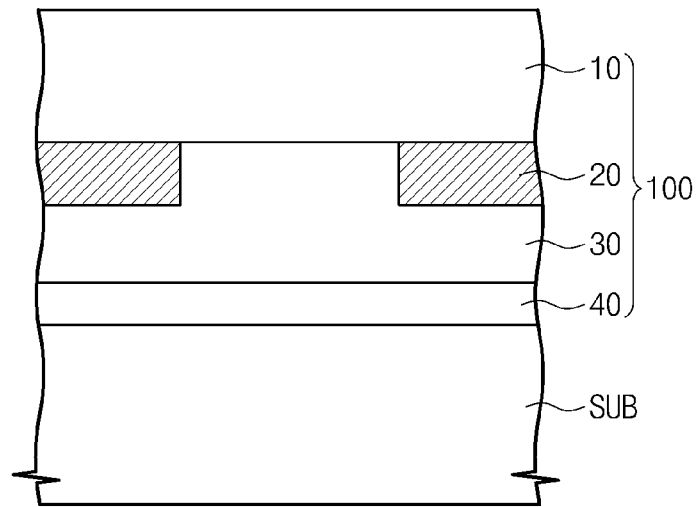
FIGS. 8A to 8C are cross-sectional views showing an exemplary embodiment of a method of manufacturing a transfer pattern according to the invention.
Figure 8B:
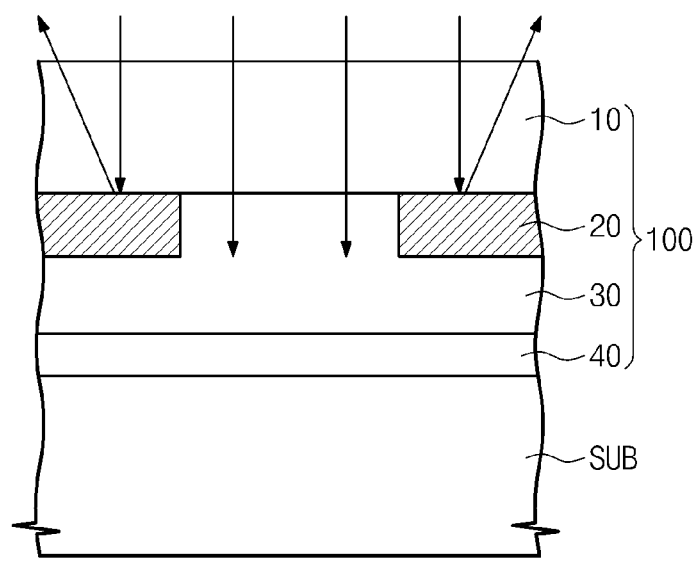
Figure 8C:
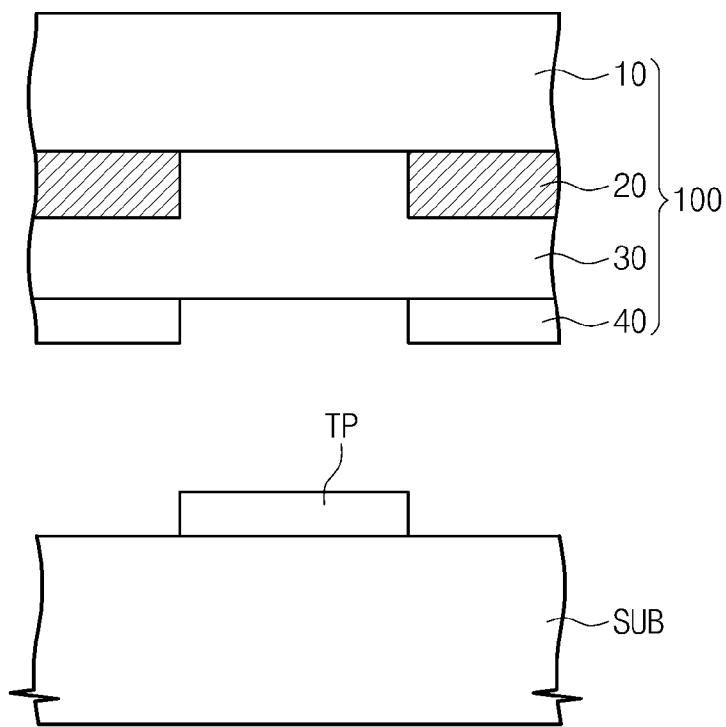

FIGS. 8A to 8C are cross-sectional views showing an exemplary embodiment of a manufacturing method of a transfer pattern according to the invention. Hereinafter, the method of forming the transfer pattern will be described in detail with reference to FIGS. 8A to 8C.

Referring to FIG. 8A, the donor substrate 100 is disposed on a transfer-target substrate SUB. As the donor substrate 100, one or more of the exemplary embodiments of the donor substrates described with reference to FIGS. 1 to 3 may be employed. Therefore, as long as the light-to-heat conversion layer 30 includes the combination layer 34, any one of the donor substrates shown in FIGS. 1 to 3 may be used.

The transfer layer 40 contacts the transfer-target substrate SUB. The transfer-target substrate SUB may further include an insulating layer (not shown). The insulating layer of the target substrate SUB includes an organic layer and/or an inorganic layer. In addition, the transfer-target substrate SUB may serve as a part of an organic light emitting display substrate.

Then, as shown in FIG. 8B, light is irradiated onto the donor substrate 100 through the base substrate 10. The light may be an ultraviolet light ray, a visible light ray or a laser beam with a predetermined wavelength. The light is reflected by portions of the light reflection layer 20 and the light is transmitted through the openings 20-OP defined in the light reflection layer 20, as illustrated in FIG. 8B.

Referring to FIG. 8C, when the transfer pattern TP is formed on the transfer-target substrate SUB, the donor substrate 100 is removed from the transfer-target-substrate SUB.

Figure 9:
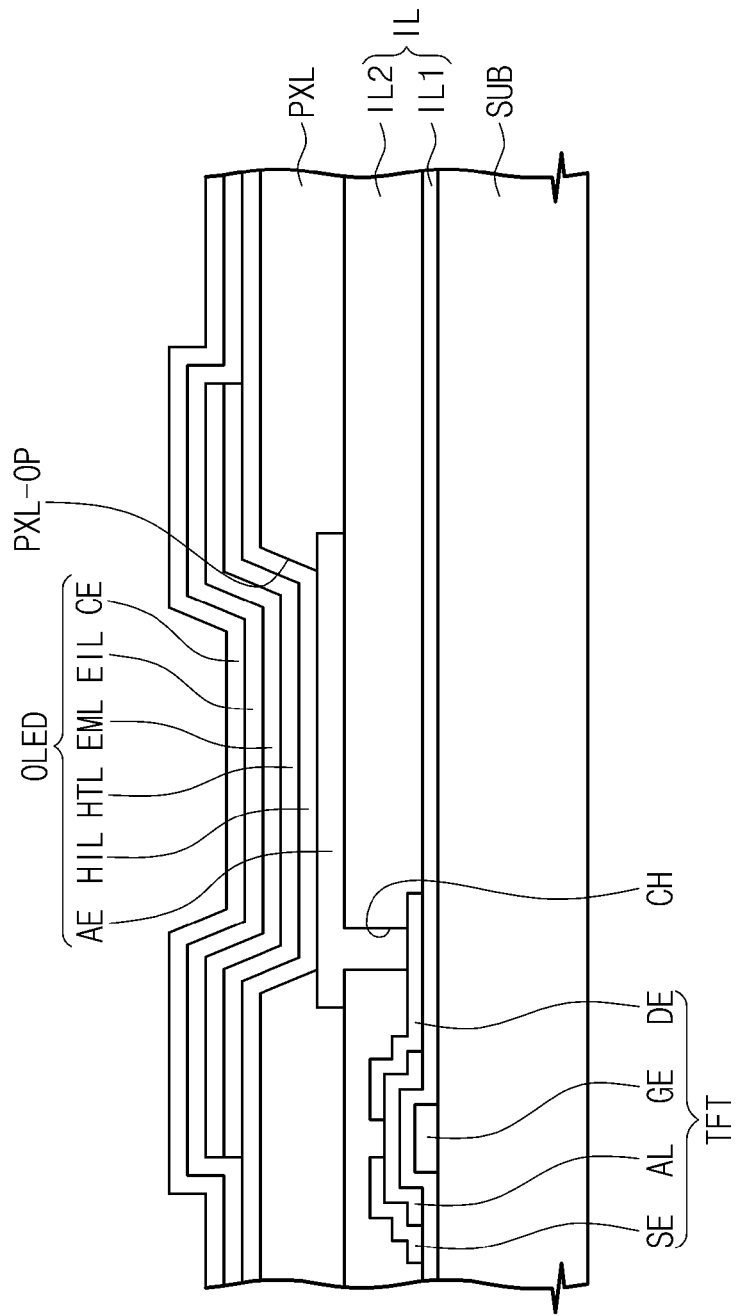
FIG. 9 is a cross-sectional view showing an exemplary embodiment of an organic light emitting display substrate including a transfer pattern according to the invention.

FIG. 9 is a cross-sectional view showing an exemplary embodiment of an organic light emitting display substrate including a transfer pattern according to the invention.

The organic light emitting display substrate includes a display substrate SUB, a thin film transistor TFT disposed on the display substrate SUB, insulating layers IL, and an organic light emitting device OLED. The thin film transistor TFT and the organic light emitting device OLED are disposed in each of pixels arranged on the organic light emitting display substrate.

Referring to FIG. 9, a control electrode GE of the thin film transistor TFT is disposed on the display substrate SUB. The display substrate SUB is the transfer-target substrate SUB described with reference to FIGS. 8A to 8C.

A first insulating layer IL1 is disposed on the display substrate SUB to cover the control electrode GE. A semiconductor layer AL is disposed on the first insulating layer IL1. An input electrode SE and an output electrode DE are disposed on the first insulating layer IL1 to be overlapped with the semiconductor layer AL.

A second insulating layer IL2 is disposed on the first insulating layer IL1 to cover the input electrode SE and the output electrode DE. The organic light emitting device OLED is disposed on the second insulating layer IL2. The organic light emitting device OLED includes a first electrode AE, a hole injection layer HIL, a hole transport layer HTL, an organic light emitting layer EML, an electron injection layer EIL, and a second electrode CE, which are sequentially stacked on the second insulating layer IL2. The first electrode AE is connected to the output electrode DE through a contact hole CH defined penetrating through the second insulating layer IL2.

A structure of the organic light emitting device OLED should not be limited to the above-mentioned structure. The electron injection layer EIL may be omitted, and/or the organic light emitting device OLED may further include an electron transport layer between the organic light emitting layer EML and the electron injection layer EIL.

A pixel defined layer PXL is disposed on the second insulating layer IL2. An opening PXL-OP is defined in the pixel defined layer PXL. The first electrode AE is exposed by the opening PXL-OP. The hole injection layer HIL and the electron injection layer EIL are overlapped to the opening PXL-OP. Different from the hole injection layer HIL and the electron injection layer EIL disposed only between the pixels, the hole transport layer HTL and the organic light emitting layer EML are further individually disposed in each pixel PXL. The hole transport layer HTL and the organic light emitting layer EML are formed in the way described with reference to FIGS. 8A to 8C.

Figure 10:
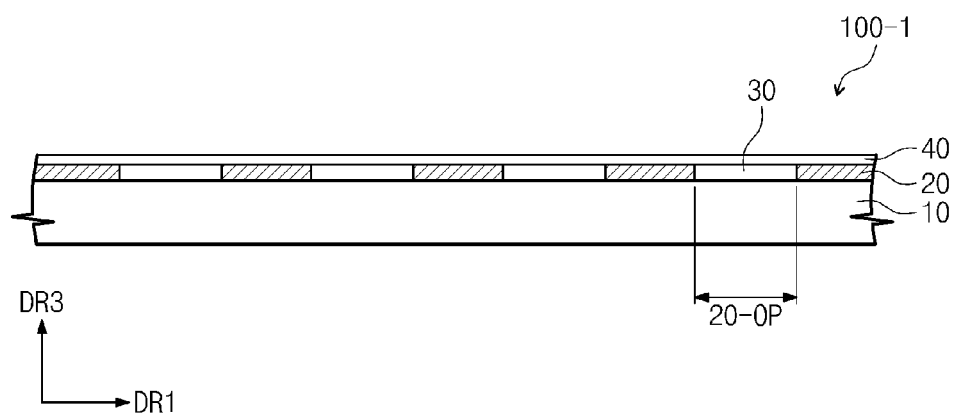
FIGS. 10 to 12 are cross-sectional views showing alternative exemplary embodiments of a donor substrate according to the invention.
Figure 11:
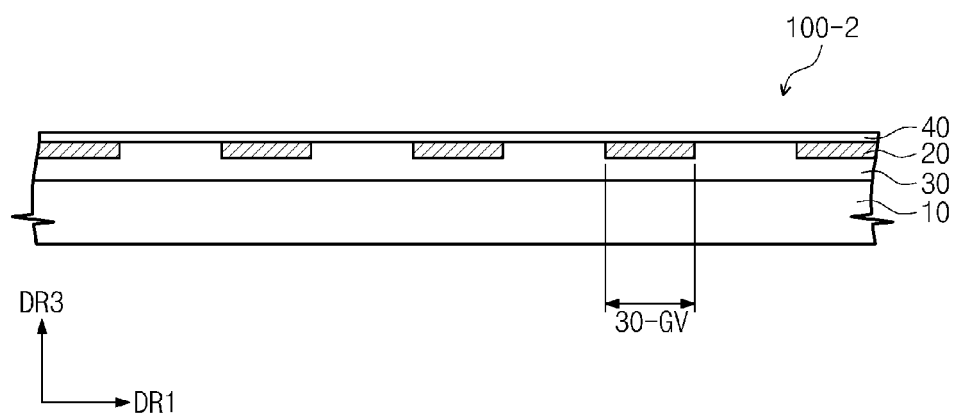
Figure 12:
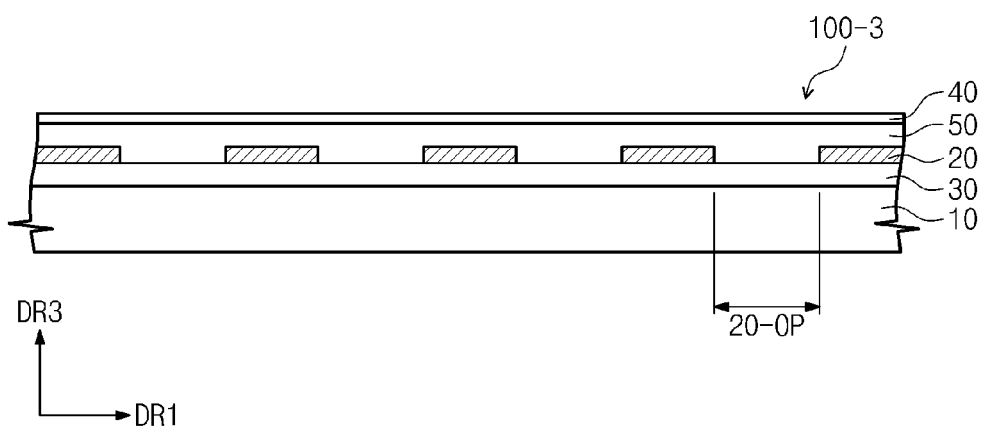

FIGS. 10 to 12 are cross-sectional views showing alternative exemplary embodiments of a donor substrate according to the invention, each of which is taken along line of I-I' of FIG. 1. Hereinafter, the alternative exemplary embodiments of the donor substrates according to the invention will be described with reference to FIGS. 10 to 12. However, detailed descriptions of the same configurations as those of the donor substrate and the forming method of the transfer pattern using the donor substrate, which are described with reference to FIGS. 1 to 9, will be omitted.

Referring to FIG. 10, a donor substrate 100-1 includes a base substrate 10, a light reflection layer 20, a light-to-heat conversion layer 30 and a transfer layer 40. The light reflection layer 20 is disposed on one surface of the base substrate 10. The light reflection layer 20 includes a plurality of openings 20-OP defined therein.

The light-to-heat conversion layer 30 is overlapped with only the openings 20-OP. That is, the light-to-heat conversion layer 30 does not overlap portions of the light reflection layer 20 which define the openings 20-OP. The light reflection layer 20 is between the base substrate 10 and the light-to-heat conversion layer 30, in the plan view. The light-to-heat conversion layer 30 includes a plurality of light-to-heat conversion discrete patterns corresponding to the openings 20-OP. The light-to-heat conversion patterns is respectively in a corresponding opening of the openings 20-OP. A thickness in the third direction DR3 of each of the light-to-heat conversion patterns is substantially equal to a depth in the third direction DR3 of the corresponding opening of the openings 20-OP. Thus, the collective light reflection layer 20 and light-to-heat conversion layer 30 may provide a flat surface. The transfer layer 40 is disposed on the flat surface provided by the collective light reflection layer 20 and light-to-heat conversion layer 30.

Referring to FIG. 11, a donor substrate 100-2 includes a base substrate 10, a light reflection layer 20, a light-to-heat conversion layer 30 and a transfer layer 40. The light-to-heat conversion layer 30 is disposed on one surface of the base substrate 10. The light-to-heat conversion layer 30 covers the entire of the one surface of the base substrate 10. A groove portion 30-GV is defined in the light-to-heat conversion layer 30. The portions of the light reflection layer 20 are inserted into the groove portion 30-GV to reflect a light incident thereto. The light-to-heat conversion layer 30 is between the base substrate 10 and the portions of the light reflection layer 20, in the plan view.

A thickness in the third direction DR3 of the light reflection layer 20 is equal to a depth in the third direction DR3 of the groove 30-GV. Thus, the collective light reflection layer 20 and light-to-heat conversion layer 30 provide a flat surface. The transfer layer 40 is disposed on the flat surface defined by the collective light reflection layer 20 and light-to-heat conversion layer 30.

Referring to FIG. 12, a donor substrate 100-3 includes a base substrate 10, a light reflection layer 20, a light-to-heat conversion layer 30, a transfer layer 40 and a planarization layer 50. The light-to-heat conversion layer 30 is disposed on one surface of the base substrate 10. The light-to-heat conversion layer 30 covers the entire of the one surface of the base substrate 10, and is a completely planar member, e.g., having no protruded portions.

The light reflection layer 20 is disposed on the light-to-heat conversion layer 30. The planarization layer 50 is disposed on the light-to-heat conversion layer 30 to cover the light reflection layer 20, and planarize step differences formed the by the portions of the light reflection layer 20 protruding from the planar light-to-heat conversion layer 30. The planarization layer 50 is an insulating layer including an organic or inorganic material. The transfer layer 40 is disposed on a flat surface provided by the planarization layer 50.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A donor substrate comprising:
   a base substrate;
   a light reflection layer on the base substrate and partially overlapping the base substrate;
   a light-to-heat conversion layer on the base substrate, and comprising a combination layer comprising an insulating material and a first metal material; and
   a transfer layer on the light-to-heat conversion layer,
   wherein a ratio of the first metal material in the combination layer to the insulating material in the combination layer increases as a distance from the base substrate increases along a thickness direction of the light-to-heat conversion layer.

2. The donor substrate of claim 1, wherein the light reflection layer comprises a second metal material.

3. The donor substrate of claim 2, wherein a plurality of openings is defined in the light reflection layer.

4. The donor substrate of claim 3, wherein the light-to-heat conversion layer overlaps portions of the light reflection layer which define the plurality of openings in the light reflection layer.

5. The donor substrate of claim 3, wherein
   the light-to-heat conversion layer comprises a plurality of light-to-heat conversion patterns, and
   the light-to-heat conversion patterns are in the plurality of openings defined in the light reflection layer, respectively.

6. The donor substrate of claim 5, wherein a thickness of the plurality of light-to-heat conversion patterns in the thickness direction of the light-to-heat conversion layer, is substantially equal to a depth of the plurality of openings defined in the light reflection layer in the thickness direction of the light-to-heat conversion layer.

7. The donor substrate of claim 1, wherein the light-to-heat conversion layer further comprises a metal layer on the combination layer and comprising the first metal material in the combination layer.

8. The donor substrate of claim 7, wherein the light-to-heat conversion layer further comprises an insulating layer between the base substrate and the combination layer and comprising the insulating material in the combination layer.

9. The donor substrate of claim 1, wherein the ratio of the first metal material in the combination layer to the insulating material in the combination layer increases linearly as the distance from the base substrate increases along the thickness direction of the light-to-heat conversion layer.

10. The donor substrate of claim 9, wherein the insulating material comprises silicon oxide or silicon nitride.

11. The donor substrate of claim 9, wherein the insulating material comprises an organic polymer.

12. The donor substrate of claim 9, wherein the first metal material comprises chromium, titanium, aluminum, molybdenum, tantalum, tungsten or an alloy thereof.

13. The donor substrate of claim 1, wherein the light-to-heat conversion layer is between the light reflection layer and the base substrate.

14. The donor substrate of claim 13, wherein
a groove portion is defined in the light-to-heat conversion layer, and
the light reflection layer is in the groove portion.

15. The donor substrate of claim 13, wherein a plurality of openings is defined in the light reflection layer,
further comprising a planarization layer between the light-to-heat conversion layer and the transfer layer and in the plurality of openings defined in the light reflection layer.

16. A method of providing a transfer pattern, comprising:
disposing a donor substrate on a transfer-target substrate to contact a transfer layer of the donor substrate with the transfer-target substrate, the donor substrate comprising:
a base substrate,
a light reflection layer on the base substrate and partially overlapping the base substrate,
a light-to-heat conversion layer on the base substrate and comprising a combination layer comprising an insulating material and a metal material, and
the transfer layer on the light-to-heat conversion layer;
irradiating a light onto the donor substrate to provide the transfer pattern on the transfer-target substrate; and
separating the donor substrate from the transfer-target substrate,
wherein a ratio of the metal material in the combination layer to the insulating material in the combination layer increases as a distance from the base substrate increases along a thickness direction of the light-to-heat conversion layer.

17. The method of claim 16, wherein the ratio of the metal material in the combination layer to the insulating material in the combination layer increases linearly as the distance from the base substrate increases along the thickness direction of the light-to-heat conversion layer.

18. The method of claim 16, wherein the providing the transfer pattern provides a pattern of an organic light emitting device.

19. The method of claim 18, wherein the providing the pattern of the organic light emitting device provides a hole transport layer or an organic light emitting layer of the organic light emitting device.

20. The method of claim 16, wherein a plurality of openings is defined in the light reflection layer.

21. The method of claim 20, wherein the light-to-heat conversion layer overlaps portions of the light reflection layer which define the plurality of openings in the light reflection layer.

22. The method of claim 20, wherein
the light-to-heat conversion layer comprises a plurality of light-to-heat conversion patterns, and
the light-to-heat conversion patterns are in the plurality of openings defined in the light reflection layer, respectively.

23. The method of claim 16, wherein the light-to-heat conversion layer further comprises a metal layer on the combination layer and comprising the metal material in the combination layer.

24. The method of claim 23, wherein the light-to-heat conversion layer further comprises an insulating layer between the base substrate and the combination layer, and comprising the insulating material in the combination layer.

25. The method of claim 16, wherein the light-to-heat conversion layer is between the light reflection layer and the base substrate.

26. The method of claim 25, wherein
a groove portion is defined in the light-to-heat conversion layer, and
the light reflection layer is in the groove portion.

27. The method of claim 26, wherein a plurality of openings is defined in the light reflection layer,
further comprising a planarization layer between the light-to-heat conversion layer and the transfer layer, and in the plurality of openings defined in the light reflection layer.

* * * * *